United States Patent
Sugo

(10) Patent No.: US 12,019,123 B2
(45) Date of Patent: Jun. 25, 2024

(54) BATTERY SYSTEM AND METHOD OF ESTIMATING POLARIZATION VOLTAGE OF SECONDARY BATTERY

(71) Applicant: TOYOTA JIDOSHA KABUSHIKI KAISHA, Toyota (JP)

(72) Inventor: Yuki Sugo, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 218 days.

(21) Appl. No.: 17/698,659

(22) Filed: Mar. 18, 2022

(65) Prior Publication Data

US 2022/0308117 A1 Sep. 29, 2022

(30) Foreign Application Priority Data

Mar. 26, 2021 (JP) .................... 2021-053161

(51) Int. Cl.
*G01R 31/3842* (2019.01)
*B60L 53/16* (2019.01)
(Continued)

(52) U.S. Cl.
CPC .......... *G01R 31/3842* (2019.01); *B60L 53/16* (2019.02); *B60L 53/20* (2019.02); *B60L 58/12* (2019.02); *H01M 10/48* (2013.01); *H02J 7/0048* (2020.01); *H02J 7/02* (2013.01); *B60L 2240/547* (2013.01); *B60L 2240/549* (2013.01);
(Continued)

(58) Field of Classification Search
CPC .............. G01R 31/3842; G01R 31/387; G01R 31/3828; G01R 31/385; B60L 53/16; B60L 53/20; B60L 58/12; B60L 2240/547; B60L 2240/549; H01M 10/48; H01M 2220/20; H01M 10/4207; H01M 10/425; H01M 10/482; H01M 10/486; H01M 2010/4271;
(Continued)

(56) References Cited

U.S. PATENT DOCUMENTS 8,078,416 B2 * 12/2011 Iwane .................. G01R 31/367
 702/65
2004/0178798 A1 * 9/2004 Kikuchi ........... G01R 19/16542
 324/426
(Continued)

FOREIGN PATENT DOCUMENTS

JP 6369340 B2 8/2018
JP 2019-045419 A 3/2019
JP 6708287 B2 6/2020

*Primary Examiner* — Thang X Le
*Assistant Examiner* — Haidong Zhang
(74) *Attorney, Agent, or Firm* — Oliff PLC

(57) ABSTRACT

A battery pack comprises a battery, a voltage sensor that detects a voltage of the battery, a power converter that transmits and receives electric power to and from the battery, an SMR and a charging relay electrically connected between the battery and the power converter, and a processor that estimates a polarization voltage Vp of the battery according to the following formula: $Vp=a \times \{1-\exp(-\sqrt{t}/b)\}$. The processor determines coefficients a and b based on first and second voltages. The first voltage is detected by the voltage sensor within a first period of time after the SMR is opened and the second voltage is detected by the voltage sensor within a second period of time before the charging relay is closed.

8 Claims, 7 Drawing Sheets

(51) Int. Cl.
  *B60L 53/20* (2019.01)
  *B60L 58/12* (2019.01)
  *H01M 10/48* (2006.01)
  *H02J 7/00* (2006.01)
  *H02J 7/02* (2016.01)
(52) U.S. Cl.
  CPC ...... *H01M 2220/20* (2013.01); *H02J 2207/20* (2020.01)
(58) Field of Classification Search
  CPC ........ H02J 7/0048; H02J 7/02; H02J 2207/20; H02J 7/005; H02J 2310/48
  USPC ......................................................... 324/426
  See application file for complete search history.

(56) References Cited

U.S. PATENT DOCUMENTS

| | | | | |
|---|---|---|---|---|
| 2009/0251103 A1* | 10/2009 | Yamamoto | ............. | B60L 58/24 |
| | | | | 324/426 |
| 2014/0139189 A1* | 5/2014 | Izumi | .................... | H02J 7/0048 |
| | | | | 320/134 |
| 2014/0225621 A1* | 8/2014 | Kimura | ............. | G01R 31/3828 |
| | | | | 324/426 |
| 2016/0318417 A1* | 11/2016 | Suzuki | ................ | H02J 7/00712 |

* cited by examiner

FIG.8

| | 10 | 20 | 30 | 40 | 50 | 60 | 70 | 80 | 90 |
|---|---|---|---|---|---|---|---|---|---|
| exp(-10 PLACE) | 22026.47 | 485165195.4 | 1.06865E+13 | 2.35385E+17 | 5.18471E+21 | 1.14201E+26 | 2.51544E+30 | 5.54062E+34 | 1.2204E+39 |
| exp(-1 PLACE) | 1 | 2 | 3 | 4 | 5 | 6 | 7 | 8 | 9 |
| | 2.718282 | 7.389056099 | 20.08553692 | 54.59815003 | 148.4131591 | 403.4287935 | 1096.633158 | 2980.957987 | 8103.083928 |
| exp(-1/10TH PLACE) | 0.1 | 0.2 | 0.3 | 0.4 | 0.5 | 0.6 | 0.7 | 0.8 | 0.9 |
| | 1.105171 | 1.221402758 | 1.349858808 | 1.491824698 | 1.648721271 | 1.8221188 | 2.013752707 | 2.225540928 | 2.459603111 |
| exp(-1/100TH PLACE) | 0.01 | 0.02 | 0.03 | 0.04 | 0.05 | 0.06 | 0.07 | 0.08 | 0.09 |
| | 1.01005 | 1.02020134 | 1.030454534 | 1.040810774 | 1.051271096 | 1.061836547 | 1.072508181 | 1.083287068 | 1.094174284 |
| exp(-1/1000TH PLACE) | 0.001 | 0.002 | 0.003 | 0.004 | 0.005 | 0.006 | 0.007 | 0.008 | 0.009 |
| | 1.001001 | 1.002002001 | 1.003004505 | 1.004008011 | 1.005012521 | 1.006018036 | 1.007024557 | 1.008032086 | 1.009040622 |
| exp(-1/10000TH PLACE) | 0.0001 | 0.0002 | 0.0003 | 0.0004 | 0.0005 | 0.0006 | 0.0007 | 0.0008 | 0.0009 |
| | 1.0001 | 1.00020002 | 1.000300045 | 1.000400008 | 1.000500125 | 1.000600018 | 1.000700245 | 1.000800032 | 1.000900405 |

BATTERY SYSTEM AND METHOD OF ESTIMATING POLARIZATION VOLTAGE OF SECONDARY BATTERY

This nonprovisional application is based on Japanese Patent Application No. 2021-053161 filed on Mar. 26, 2021 with the Japan Patent Office, the entire contents of which are hereby incorporated by reference.

BACKGROUND

Field

The present disclosure relates to a battery system and a method of estimating a polarization voltage of a secondary battery.

Description of the Background Art

A battery pack disclosed in Japanese Patent Laying-Open No. 2019-45419 includes a battery, a voltage detection unit that detects a voltage of the battery, and an estimation unit that estimates an open circuit voltage after depolarization of the battery. The estimation unit obtains the first voltage (OCV1) and the second voltage (OCV2) in a pause period after the discharge of the battery and before the polarization of the battery is eliminated. OCV1 is a voltage detected by the voltage detection unit after a first predetermined time has elapsed from the start of the pause period. OCV2 is a voltage detected by the voltage detection unit after a second predetermined time longer than the first predetermined time has elapsed from the start of the pause period. The estimation unit estimates a result of adding a value obtained by multiplying OCV1 or OCV2 by a ratio of OCV1 to OCV2 (r1=OCV2/OCV1 or the like) and a coefficient as the open circuit voltage after the battery is depolarized.

SUMMARY

A method of estimating a battery's characteristics, specifically a secondary battery's SOC (State Of Charge), full charge capacity and the like based on the secondary battery's open circuit voltage (OCV), is widely used. In order to improve accuracy of estimation of the battery's characteristics, there is always a demand to estimate the open circuit voltage of the secondary battery with high accuracy. And in order to estimate the open circuit voltage of the secondary battery with high accuracy, it is required to estimate the polarization voltage of the secondary battery with high accuracy.

The present disclosure is provided to address the above issue, and an object of the present disclosure is to estimate a polarization voltage of a secondary battery with high accuracy.

(1) According to a first aspect of the present disclosure, a battery system comprises: a secondary battery; a voltage sensor that detects a voltage of the secondary battery; a power converter that transmits and receives power to and from the secondary battery; a relay electrically connected between the secondary battery and the power converter; and a processor that estimates a polarization voltage of the secondary battery according to the following expression (A1):

$$Vp = a \times \{1 - \exp(-\sqrt{t}/b)\} \quad \text{(A1)}$$

where the polarization voltage is represented by Vp, an elapsed time after the relay is opened is represented by t, and first and second coefficients are represented by a and b, respectively. The processor determines the first and second coefficients based on first and second voltages. The first voltage is detected by the voltage sensor within a first period of time after the relay is opened. The second voltage is detected by the voltage sensor within a second period of time before the relay is closed.

(2) Differentiating both sides of the expression (A1) with respect to time derives the following expression (A2):

$$dVp(t)/dt = a \times \{\exp(-\sqrt{t}/b)\}/b \quad \text{(A2).}$$

The processor substitutes a rate of change of the polarization voltage into the expression (A2) to obtain a relational expression between the first coefficient and the second coefficient. The rate of change is calculated based on the first voltage detected a plurality of times within the first period of time. The processor determines the first and second coefficients based on the relational expression and the second voltage.

(3) The battery system is mounted on a vehicle. The vehicle includes an inlet that allows a connector of a charging cable to be connected thereto. The power converter charges the secondary battery using external power supplied via the inlet. The processor uses as the second voltage a voltage detected by the voltage sensor at a time when the connector is connected to the inlet.

(4) The first period of time is from a time when the relay is opened to a time when the processor stops. The second period of time is from a time when the processor starts to a time when the relay is closed.

In the configurations (1) to (4), the above expression (A1) is used to estimate the polarization voltage of the secondary battery. As a result of intensive studies by the present inventor, it has been found that the expression (A1) can accurately express the behavior of the actual polarization voltage. Therefore, according to the above configuration, the polarization voltage of the secondary battery can be estimated with high accuracy. Further, in the configuration (2), the first and second coefficients are specified using the rate of change in the polarization voltage in the first period of time, in other words, a detection value of a decreasing rate of the polarization voltage. Accordingly, it is possible to accurately reflect the state in which the polarization voltage is eliminated in the expression (A1), so that the polarization voltage of the secondary battery can be estimated with higher accuracy.

(5) The battery system further comprises a memory in which a map is stored. In the map, nine numerical values each corresponding to one of nine patterns of numerals are defined for each of a plurality of places of an exponent used in an exponential function. When the processor calculates an exponential function in the expression (A1), the processor refers to the map to read a numerical value corresponding to a numeral of each of a plurality of places of an exponent of the exponential function in the expression (A1) and multiplies read numerical values together.

According to the configuration (5), it is possible to reduce the calculation load of the processor when calculating the exponential function.

(6) According to a second aspect of the present disclosure, a battery system comprises: a secondary battery; a voltage sensor that detects a voltage of the secondary battery; a current sensor that detects a current flowing through the secondary battery; a power converter that transmits and receives power to and from the secondary battery; and a processor that estimates a polarization voltage of the secondary battery according to the following expression (A3):

$$Vp = a \times \{1 - \exp(-\sqrt{t/b})\} \quad (A3)$$

where the polarization voltage is represented by Vp, an elapsed time after the current detected by the current sensor falls below a first predetermined value is represented by t, and first and second coefficients are represented by a and b, respectively. The processor determines the first and second coefficients based on first and second voltages. The first voltage is detected by the voltage sensor within a first period of time after the current detected by the current sensor falls below the first predetermined value. The second voltage is detected by the voltage sensor within a second period of time before the current detected by the current sensor exceeds a second predetermined value.

(7) Differentiating both sides of the expression (A3) with respect to time derives the following expression (A4):

$$dVp(t)/dt = a \times \{\exp(-\sqrt{t/b})\}/b \quad (A4).$$

The processor substitutes a rate of change of the polarization voltage into the expression (A4) to obtain a relational expression between the first coefficient and the second coefficient. The rate of change is calculated based on the first voltage detected a plurality of times within the first period of time. The processor determines the first and second coefficients based on the relational expression and the second voltage.

(8) The battery system is mounted on a vehicle. The vehicle includes an inlet that allows a connector of a charging cable to be connected thereto. The power converter charges the secondary battery using external power supplied via the inlet. The processor uses as the second voltage a voltage detected by the voltage sensor at a time when the connector is connected to the inlet.

(9) The first period of time is from a time when the current detected by the current sensor falls below the first predetermined value to a time when the processor stops. The second period of time is from a time when the processor starts to a time when the current detected by the current sensor exceeds the second predetermined value.

According to the configurations (6) to (9), as well as the configurations (1) to (4), the polarization voltage of the secondary battery can be estimated with higher accuracy.

(10) The battery system further comprises a memory in which a map is stored. In the map, nine numerical values each corresponding to one of nine patterns of numerals are defined for each of a plurality of places of an exponent used in an exponential function. When the processor calculates an exponential function in the expression (A3), the processor refers to the map to read a numerical value corresponding to a numeral of each of a plurality of places of an exponent of the exponential function in the expression (A3) and multiplies read numerical values together.

According to the configuration (10), as well as the configuration (5), it is possible to reduce the calculation load of the processor when calculating the exponential function.

(11) According to a third aspect of the present disclosure, a method for estimating a polarization voltage of a secondary battery comprises three steps. A first step is detecting a first voltage of the secondary battery by a voltage sensor within a first period of time after a relay electrically connected between the secondary battery and a power converter is opened. A second step is detecting a second voltage of the secondary battery by the voltage sensor within a second period of time before the relay is closed. A third step is estimating a polarization voltage of the secondary battery according to the following expression (A5):

$$Vp = a \times \{1 - \exp(-\sqrt{t/b})\} \quad (A5)$$

where the polarization voltage is represented by Vp, an elapsed time after the relay is opened is represented by t, and first and second coefficients are represented by a and b, respectively. The estimating (or the third step) includes determining the first and second coefficients based on the first and second voltages.

(12) According to a fourth aspect of the present disclosure, a method for estimating a polarization voltage comprises three steps. A first step is detecting a first voltage of the secondary battery by a voltage sensor within a first period of time after a current flowing through the secondary battery, as detected by a current sensor, falls below a first predetermined value. A second step is detecting a second voltage of the secondary battery by the voltage sensor within a second period of time before the current detected by the current sensor exceeds a second predetermined value. A third step is estimating a polarization voltage of the secondary battery according to the following expression (A6):

$$Vp = a \times \{1 - \exp(-\sqrt{t/b})\} \quad (A6)$$

where the polarization voltage is represented by Vp, an elapsed time after the current detected by the current sensor falls below the first predetermined value is represented by t, and first and second coefficients are represented by a and b, respectively. The estimating includes determining the first and second coefficients based on the first and second voltages.

According to the methods (11) and (12), as well as the configurations (1) and (6), the polarization voltage of the secondary battery can be estimated with high accuracy.

These and other objects, features, aspects, and advantages of the invention will become apparent from the following detailed description of the invention taken in conjunction with the accompanying drawings.

BRIEF DESCRIPTION OF THE DRAWINGS

FIG. 8 is a conceptual diagram of a map used in this modified example.

DESCRIPTION OF THE PREFERRED EMBODIMENTS

Figure 1:
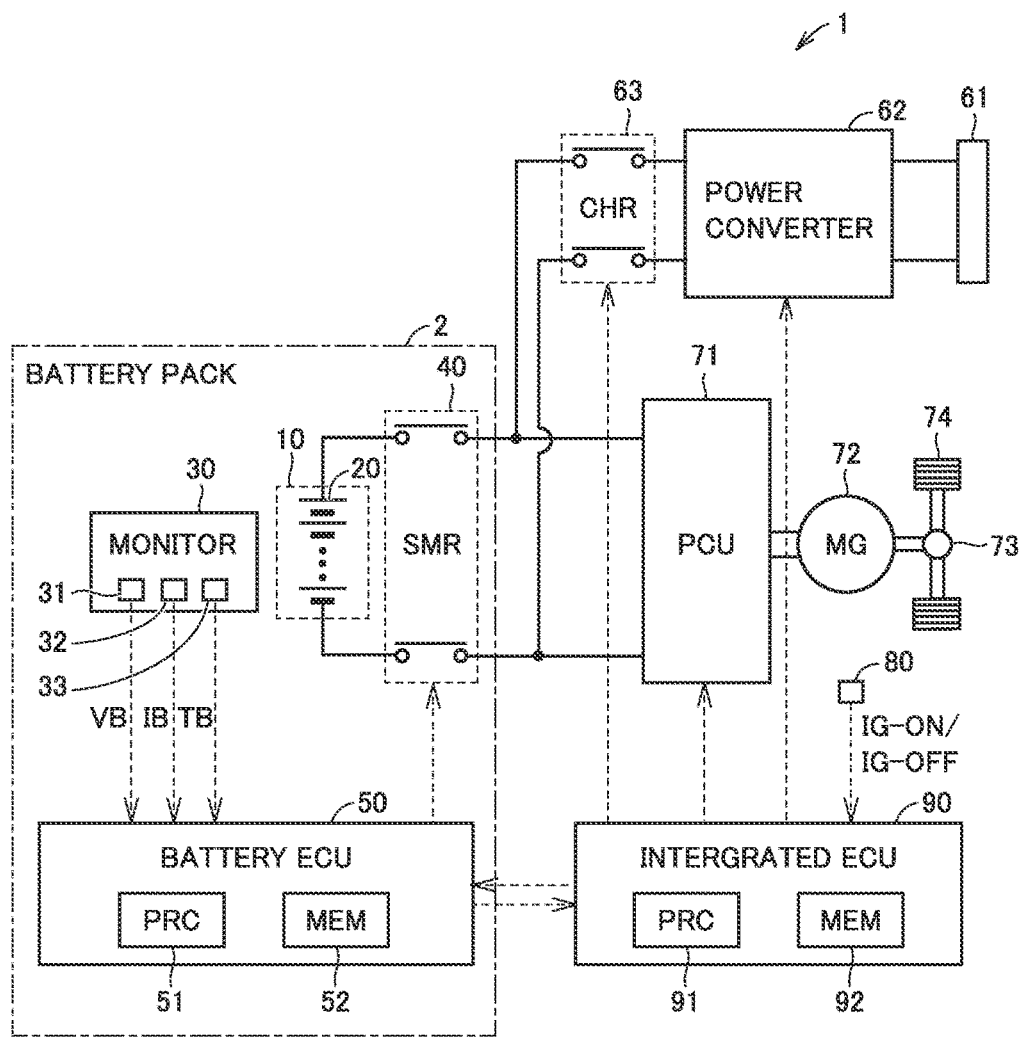
FIG. 1 is a diagram schematically showing an overall configuration of a vehicle in which a battery system according to an embodiment of the present disclosure is mounted.

Hereinafter, embodiments of the present disclosure will be described in detail with reference to the drawings. In the drawings, the same or corresponding portions are denoted by the same reference numerals, and the description thereof will not be repeated.

Hereinafter, an example in which the battery system according to the present disclosure is mounted on a vehicle will be described. However, the use of the battery system according to the present disclosure is not limited to a vehicle, and may be fixed use, for example.

EMBODIMENTS

<System Configuration>

FIG. 1 is a diagram schematically showing an overall configuration of a vehicle in which a battery system according to an embodiment of the present disclosure is mounted. The vehicle 1 includes a battery pack 2. The battery pack 2 corresponds to the "battery system" according to the present disclosure. The vehicle 1 is, for example, a battery electric vehicle (BEV). The vehicle 1 is configured to enable "plug-in charging" by electric power supplied from the outside.

However, the type of vehicle in which the battery system according to the present disclosure can be mounted is not particularly limited. The hybrid electric vehicle (HEV), the plug-in hybrid electric vehicle (PHEV), or a fuel cell electric vehicle (FCEV) may be used.

The battery pack 2 includes a battery 10. The battery 10 is an assembled battery including a plurality of cells 20. The battery pack 2 further includes a monitoring unit 30, a system main relay (SMR) 40, and a battery electronic control unit (ECU) 50. The vehicle 1 further includes an inlet 61, a power converter 62, a charge relay (CHR) 63, a power control unit (PCU) 71, a motor generator 72, a power transmission gear 73, driving wheels 74, a power switch 80, and an integrated ECU 90.

The battery 10 stores electric power for driving the motor generator 72, and supplies electric power to the motor generator 72 through the PCU 71. The battery 10 is charged by receiving generated power through the PCU 71 when the motor generator 72 generates power.

Each cell 20 included in the battery 10 is a secondary battery such as a lithium ion battery or a nickel-hydrogen battery. Since the internal configuration of the battery 10 is not particularly limited in the present embodiment, the battery 10 will be described below as a monitoring unit. The battery 10 corresponds to the "secondary battery" according to the present disclosure.

The monitoring unit 30 includes various sensors for monitoring the state of the battery 10. Specifically, the monitoring unit 30 includes a voltage sensor 31, a current sensor 32, and a temperature sensor 33. The voltage sensor 31 detects the voltage VB of the battery 10. The current sensor 32 detects a current IB input to and output from the battery 10. The temperature sensor 33 detects the temperature TB of the battery 10. Each sensor outputs the detected value to the battery ECU 50.

The SMR 40 is provided on a power line connecting the battery 10 and the PCU 71 and the power converter 62. The SMR 40 is opened and closed in accordance with a command from the battery ECU 50. When the SMR 40 is opened (off), the battery 10 is electrically disconnected from the PCU 71 and the power converter 62.

The battery ECU 50 includes a processor 51 such as a CPU (Central Processing Unit), a memory 52 such as a ROM (Read Only Memory) and a RAM (Random Access Memory), and an input/output port (not shown) through which various signals are input/output. The battery ECU 50 manages the battery 10 based on the signals received from the sensors and the programs and maps stored in the memory 52. A process executed by the battery ECU 50 in the present embodiment is a process of estimating the full charge capacity of the battery 10. This process is referred to as "capacity estimation process" and will be described in detail later. The processor 51 of the battery ECU 50 corresponds to the "processor" according to the present disclosure.

The inlet 61 is configured such that a connector (not shown) provided at the tip of the charging cable is connected together with mechanical connection. The electrical connection between the charging facility (not shown) and the vehicle 1 is ensured by connecting the inlet 61 and the connector. In addition, the integrated ECU 90 of the vehicle 1 and the control device (not shown) of the charging facility can exchange various commands and data with each other in accordance with a predetermined communication standard.

The power converter 62 is, for example, an AC/DC converter. The power converter 62 converts AC power supplied from a charging facility via a charging cable into DC power for charging the battery 10. The power converter 62 corresponds to the "power converter" according to the present disclosure.

The charging relay 63 is connected in series with the SMR 40 to a power line connecting the battery 10 and the power converter 62. The charging relay 63 is opened and closed, for example, in accordance with an instruction from the integrated ECU 90. When the charging relay 63 is closed and the SMR 40 is closed, the battery 10 can be charged by the power from the inlet 61.

The SMR 40 and the charging relay 63 correspond to the "relay" according to the present disclosure. The state in which the "relay" according to the present disclosure is opened is a state in which at least one of the SMR 40 and the charging relay 63 is opened. The "relay" according to the present disclosure is closed in a state in which both the SMR 40 and the charging relay 63 are closed.

The PCU 71 is electrically connected between the SMR 40 and the motor generator 72. The PCU 71 includes a converter and an inverter (both not shown), and drives the motor generator 72 in accordance with instructions from the integrated ECU 90.

The motor generator 72 is an AC rotating electrical machine, and is, for example, a permanent magnet type synchronous motor including a rotor in which permanent magnets are embedded. The output torque of the motor generator 72 is transmitted to the driving wheel 74 through the power transmission gear 73, thereby causing the vehicle 1 to travel. Further, the motor generator 72 can generate electric power by the rotational force of the driving wheel 74 during the braking operation of the vehicle 1. The power generated by the motor generator 72 is converted into the charging power of the battery 10 by the PCU 71.

The power switch 80 accepts a user operation for selecting a power supply position. The user selects the power supply position by operating the power switch 80 and the brake pedal (not shown). In the present embodiment, the power supply position includes an ignition off (IG-OFF) position, an accessory (ACC) position, an ignition on (IG-ON) position, an activation position, and a Ready-ON position.

The IG-OFF position corresponds to the power-off state of the vehicle 1. In this power supply position, power supply to each device mounted on the vehicle 1 is cut off. In the ACC position, power is supplied to accessory devices such as audio and an air conditioner. In the IG-ON position, electric power is supplied to devices necessary for traveling of the vehicle 1. When the starting position is selected, the system is started so that the vehicle 1 can travel. After the system is started, a system check is executed. When the traveling condition is satisfied, the vehicle 1 moves to the Ready-ON position where the vehicle 1 can travel in response to the operation of the accelerator pedal (not shown) by the user.

Like the battery ECU 50, the integrated ECU 90 includes a processor 91, a memory 92, and an input/output port (not shown). The integrated ECU 90 executes various controls for controlling the vehicle 1 to a desired state based on signals received from the sensors and programs and maps stored in the memory 92. For example, the integrated ECU 90 controls charging and discharging of the battery 10 by controlling the PCU 71 in cooperation with the battery ECU 50.

<Estimation of Full Charge Capacity>

In the battery pack 2 configured as described above, the battery ECU 50 estimates the open circuit voltage (OCV) of the battery 10, and estimates the full charge capacity of the battery 10 based on the estimated value. As described below, in order to estimate the OCV of the battery 10 with high precision, it is desirable to estimate the polarization voltage Vp of the battery 10 with high precision.

In view of this, in the present embodiment, a relational expression representing the behavior of the polarization voltage Vp of the battery 10 well is employed. Then, by actually measuring the decreasing speed (polarization eliminating speed) of the polarization voltage Vp using the voltage sensor 31, the manner in which the polarization voltage Vp is eliminated is accurately reflected in the above relational expression. Hereinafter, first, the overall flow of the process of estimating the full charge capacity of the battery 10 will be described.

Figure 2:
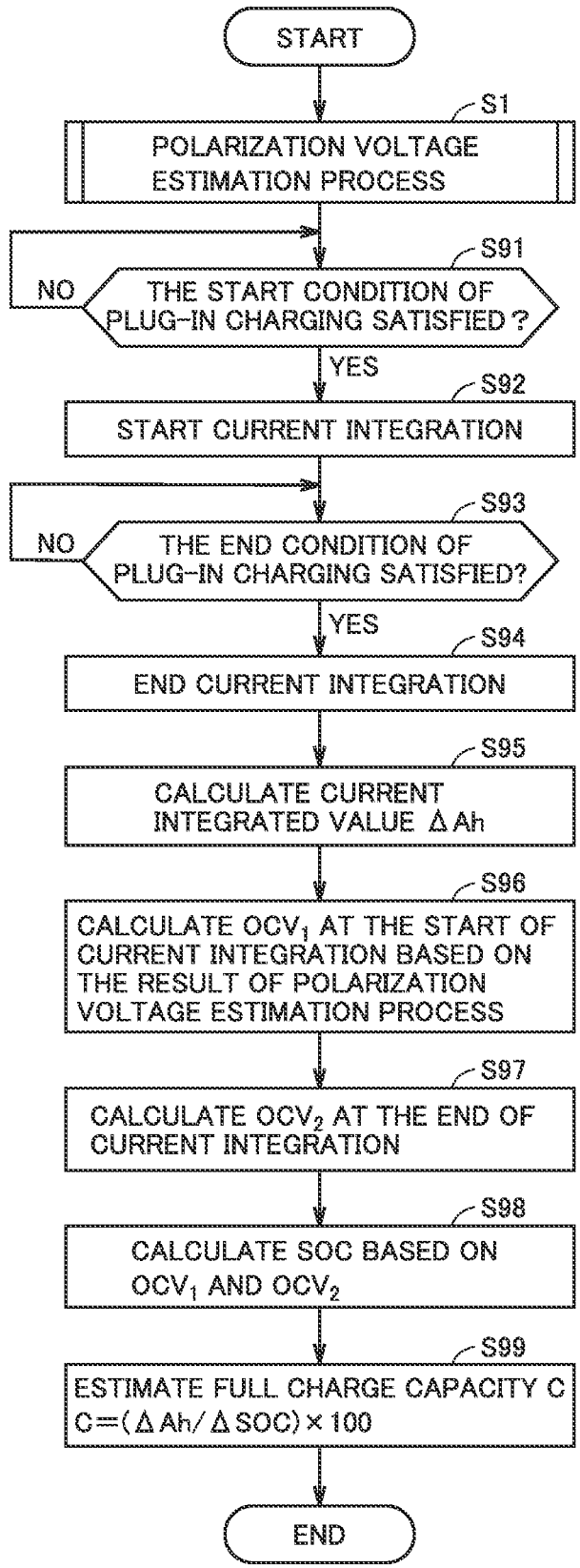
FIG. 2 is a flowchart showing a processing procedure of capacity estimation processing in the present embodiment.

FIG. 2 is a flowchart showing a processing procedure of capacity estimation processing in the present embodiment. This flowchart is executed, for example, when a predetermined condition is satisfied (For example, when a predetermined period of time has elapsed since the previous estimation of the full charge capacity C of the battery 10). The steps included in the flowchart shown in FIG. 2 and other flowcharts described later are basically realized by software processing by the battery ECU 50, but may be realized by hardware (electrical circuit) arranged in the battery ECU 50. The flowchart shown in FIG. 2 also includes processing executed by the integrated ECU 90, such as processing for starting and terminating plug-in charging. Hereinafter, this step is abbreviated as S.

In S1, the battery ECU 50 executes a "polarization voltage estimation process" for estimating the polarization voltage of the battery 10. Although the details will be described later with reference to FIG. 3, in the polarization voltage estimation process, the SMR 40 is opened in accordance with the IG-OFF operation of the vehicle 1. Thus, the battery 10 is electrically disconnected from the PCU 71 and the power converter 62.

In S91, the battery ECU 50 determines whether or not the plug-in charging start condition is satisfied. When a connector (not shown) provided at a distal end of the charging cable is connected to the inlet 61 and necessary data is exchanged between the integrated ECU 90 and a control device (not shown) of the charging facility, a plug-in charging start condition is satisfied. When the start condition of plug-in charging is satisfied (YES in S91), plug-in charging of the vehicle 1 is started. The battery ECU 50 starts current integration along with the start of plug-in charging of the vehicle 1 (S92). That is, the battery ECU 50 integrates the detection values of the current sensor 32.

In S93, battery ECU 50 determines whether or not the end condition of plug-in charging is satisfied. For example, when the battery 10 is charged with a predetermined amount of electric power or when a predetermined time has arrived, the end condition of plug-in charging is satisfied. When the end condition of plug-in charging is satisfied (YES in S93), plug-in charging of the vehicle 1 is completed. Upon completion of plug-in charging of the vehicle 1, the battery ECU 50 ends the current integration (S94).

In S95, battery ECU 50 calculates current integration amount ΔAh (unit: Ah) from the start of current integration (S92) to the end of current integration (S94).

In S96, the battery ECU 50 estimates the OCV of the battery 10 at the start of current integration based on the result of the polarization voltage estimation process in S1. This OCV is referred to as $OCV_1$.

In S97, battery ECU 50 calculates the OCV of battery 10 at the end of current integration. This OCV is described as "$OCV_2$". The $OCV_2$ can be calculated from the following equation (1) using the voltage VB (referred to as "$VB_2$") obtained from the voltage sensor 31 at the end of current integration, the polarization voltage $Vp_2$ of the battery 10 at the end of current integration, the IB obtained from the current sensor 32 at the end of current integration, and the internal resistance R of the battery 10.

$$OCV_2 = VB_2 - Vp_2 \times IB \times R \qquad (1)$$

Since the polarization voltage $Vp_2$ depends on the current IB charged in the battery 10, the relationship between the polarization voltage $Vp_2$ and the current IB is measured in advance and stored in the memory 52 as a map. Thus, a value corresponding to the current IB obtained from the current sensor 32 at the end of current integration can be used as the polarization voltage $Vp_2$. On the other hand, the internal resistance R has temperature dependence. Therefore, by storing a map representing the temperature dependence of the internal resistance R in the memory 52, a value corresponding to the temperature TB obtained from the temperature sensor 33 can be used as the internal resistance R.

In S98, battery ECU 50 calculates SOC change amount ΔSOC of battery 10 during current integration based on $OCV_1$ of battery 10 at the start of current integration and $OCV_2$ of battery 10 at the end of current integration. The memory 52 of the battery ECU 50 stores a curve (SOC-OCV curve) indicating the correspondence between the SOC of the battery 10 and the OCV. The battery ECU 50 can calculate, on the SOC-OCV curve, a difference between an SOC (referred to as SOC2) corresponding to $OCV_2$ and an SOC (referred to as $SOC_1$) corresponding to $OCV_1$ as ΔSOC (see the following equation (2)).

$$\Delta SOC = SOC_2 - SOC_1 \qquad (2)$$

In S99, battery ECU 50 estimates full charge capacity C of battery 10 based on current integrated value ΔAh calculated in S95 and ΔSOC calculated in S98. More specifically, the full charge capacity C of the battery 10 can be calculated according to the following equation (3) where the ratio of the charge current value ΔAh to the ΔSOC is equal to the ratio of the full charge capacity C to the ΔSOC=100%. Since the full charge capacity C0 in the initial state is known from the specifications of the battery 10, the battery ECU 50 may further calculate the capacity maintenance ratio Q from the full charge capacity C (Q=C/C0).

$$C = \Delta Ah / \Delta SOC \times 100 \qquad (3)$$

It is not essential that the battery ECU 50 estimate the full charge capacity of the battery 10 using the result of the polarization voltage estimation process. The use of the result of the polarization voltage estimation process is not particularly limited, and the battery ECU 50 may estimate the SOC of the battery 10, for example, using the result of the polarization voltage estimation process. Alternatively, the battery ECU 50 may simply estimate the polarization voltage Vp of the battery 10.

<Polarization Value Estimation Process>

Figure 3:
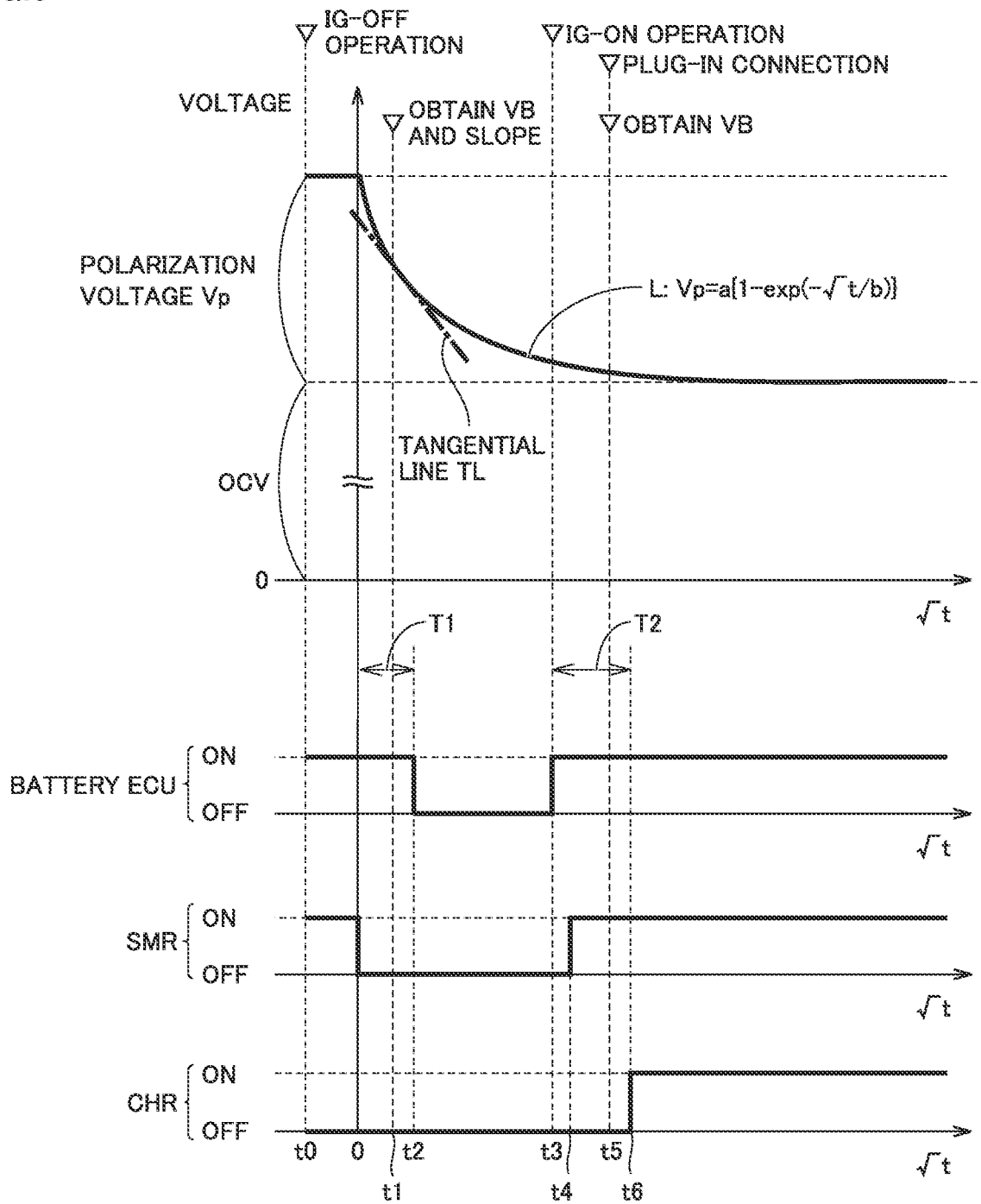
FIG. 3 is a time chart for explaining polarization voltage estimation processing in the present embodiment.

FIG. 3 is a time chart for explaining polarization voltage estimation processing in the present embodiment. The horizontal axis represents the elapsed time (more specifically, the square root of the elapsed time t). The vertical axis represents the voltage (OCV and polarization voltage Vp) in the upper half. The lower half of the vertical axis represents the operation (ON)/stop (OFF) of the battery ECU 50 and the closing (ON)/opening (OFF) of the SMR 40 and the charging relay 63.

At the initial time t0, the battery ECU 50 is operating. While the SMR 40 is closed, the charging relay 63 is opened. At this initial time t0, the user performs an IG-OFF operation of pressing the power switch 80. Then, the SMR 40 is opened. The open time of the SMR 40 is time 0. Thereafter (typically 10 seconds to 20 seconds after the SMR 40 is opened), the battery ECU 50 stops its operation (time t2).

When the SMR 40 is opened, the polarization of the battery 10 is initially eliminated (relaxed) quickly, but then, as time elapses, the polarization of the battery 10 is eliminated gently. As a result of repeating the polarization voltage measurement, the present inventors have found that the approximation formula shown in the following formula (4) best represents the behavior (time transition) of the actual polarization voltage Vp (see curve L in the figure).

$$Vp(t)=a\{1-\exp(-\sqrt{(t)}/b)\} \quad (4)$$

In Equation (4), a and b are both positive coefficients. When both the coefficients a and b are determined, the polarization voltage Vp at an arbitrary time t can be estimated according to Equation (4). The coefficients a and b can be specified by the following calculation process, for example.

First, the following equation (5) is obtained by differentiating both sides of equation (4) with respect to time.

$$dVp(t)/dt=a\times\{\exp(-\sqrt{(t)}/b)\}/b \quad (5)$$

A period from when the SMR 40 is opened to when the operation of the battery ECU 50 is stopped is indicated by T1 in the figure. The period T1 is an example of the "first period" according to the present disclosure. In this embodiment, it is assumed that Formula (5) is satisfied at an arbitrary time t1 in the period T1, and the time t1 is substituted into Formula (5). Thus, the following formula (6) is obtained. The left side of Equation (6) corresponds to the slope of the tangent TL of the curve L at time t1.

$$dVp(t1)/dt=a\times\{\exp(-\sqrt{(t1)}/b)\}/b \quad (6)$$

In the present embodiment, separately from the slope of the tangent line TL, the rate r(t1) of change in the voltage VB at the same time t1 is calculated based on the detection value of the voltage sensor 31. More specifically, the rate of change in the voltage VB at the time t1 can be calculated based on two or more detected values (for example, the voltage VB at a time before the time t1 and the voltage VB at a time after the time t1) of the voltage VB in the period T1. The rate of change is described as r(t1).

Since the battery 10 is left uncharged and discharged after the SMR 40 is opened, the OCV of the battery 10 is constant. Therefore, the temporal change of the voltage VB is derived from the temporal change of the polarization voltage Vp. Therefore, the slope (dVp(t1)) of tangent TL at time t1 obtained from equation (5) of time differentiation and the rate r(t1) of change in voltage VB at time t1 obtained from the detected value of voltage VB by voltage sensor 31 may be regarded as equal to each other (dVp(t1)/dt=r(t1)). Therefore, the left side of the formula (6) can be replaced by the rate r(t1) of change in the voltage VB at the time t1 (the following formula (7)).

$$r(t1)=a\times\exp\{(-\sqrt{(t1)}/b)\}/b \quad (7)$$

When the equation (7) is solved for the coefficient a, it is organized as the following equation (8). The following (8) corresponds to the "relational expression" according to the present disclosure.

$$a=r(t1)\times b/\{\exp(-\sqrt{(t1)}/b)\} \quad (8)$$

After the battery 10 is continuously left, the user performs an IG-ON operation at time t3. Then, the battery ECU 50 starts to operate again, and the SMR 40 is closed (time t4). Then, at time t5, the user connects the connector provided at the tip of the charging cable to the inlet 61 (plug-in connection). In this example, the battery ECU 50 obtains the voltage VB from the voltage sensor 31 at the time of plug-in connection. Thereafter, the charging relay 63 is closed (time t6).

Since the voltage VB at an arbitrary time t is the sum of the polarization voltage Vp and OCV at the time t, the voltage VB is expressed by the following expression (9).

$$VB(t)=a\times\{1-\exp(-\sqrt{(t)}/b)\}+OCV \quad (9)$$

From the expression (9), the following expression (10) is satisfied for the detected value of the voltage VB of the voltage sensor 31 at the plug-in connection time t5.

$$VB(t5)=a\times\{1-\exp(-\sqrt{(t5)}/b)\}+OCV \quad (10)$$

Further, the detection value of the voltage VB of the voltage sensor 31 at a time different from the plug-in connection time t5 (time t1 in this example) satisfies the following expression (11).

$$VB(t1)=a\times\{1-\exp(-\sqrt{(t1)}/b)\}+OCV \quad (11)$$

The coefficient a on the right side of the equations (10) and (11) is expressed using the coefficient b as in the equation (8). Therefore, it can be said that two equations (10) and (11) are obtained for two unknowns of the coefficient b and the OCV. Therefore, the coefficients b and OCV can be obtained by solving the equations (10) and (11) simultaneously. Further, the coefficient a can be obtained from Expression (8).

As described above, in the present embodiment, the polarization voltage Vp is calculated using the condition that the slope (dVp(t1)) of the tangent line TL of the curve L and the rate r (t1) of change in the voltage VB detected by the voltage sensor 31 are equal to each other at the time t1 within the period T1 in which the SMR 40 is opened and the polarization elimination of the battery 10 is rapidly advanced. The slope (dVp(t1) of the tangent line TL and the rate r(t1) of change in the voltage VB are indexes representing the rate at which the polarization elimination of the battery 10 proceeds (polarization elimination rate). That is, in the present embodiment, it can be said that the polarization voltage Vp is calculated in consideration of the polarization eliminating speed of the battery 10, whereby the speed/slow of the polarization eliminating speed can be accurately reflected in the polarization voltage Vp. As a result, the OCV of the battery 10 can be estimated with high accuracy.

In the expression (10), the voltage VB of the voltage sensor 31 at the time t5 of plug-in connection is used as an example. An arbitrary time in the period T2 between the time t3 at which the operation of the battery ECU 50 starts in response to the IG-ON operation and the time t6 at which the charging relay 63 is closed can be used in the expression (10). The period T2 is an example of the "second period" according to the present disclosure. It is desirable that the time used in Equation (10) be a time before time t6 and as slow as possible. This is because the calculation accuracy of the curve L representing the polarization voltage Vp can be improved by ensuring as long a time difference as possible between the time used in the expression (10) and the time (t1 in this example) used in the expression (11). On the other hand, since there is a possibility that actual power transmission of plug-in charging will start after the charge relay 63 is closed, it is desirable not to be at a time after the time t6.

In FIG. 3, an example in which the time at which the SMR 40 is opened is set as the starting point (time 0), in other words, an example in which the opening of the SMR 40 is used as the trigger has been described. However, the polarization voltage estimation process may be performed under a condition in which it can be determined that the voltage of the battery 10 is OCV, and it is not essential to trigger opening of the SMR 40. When the SMR 40 is opened, the current IB flowing through the battery 10 rapidly decreases and approaches 0. Accordingly, when the current IB detected by the current sensor 32 falls below the first predetermined value, the battery ECU 50 may determine that the voltage of the battery 10 is OCV and execute the polarization voltage estimation process. In this case, the period T1 during which the depolarization of the battery 10 rapidly proceeds can be determined based on the time when the current IB falls below the first predetermined value instead of the open time of the SMR 40. On the other hand, the period T2 can be determined based on the time when the current IB exceeds the second predetermined value instead of the time when both the SMR 40 and the charging relay 63 are closed. The second predetermined value may be the same as or smaller than the first predetermined value.

<Polarization Estimation Flow>

Figure 4:
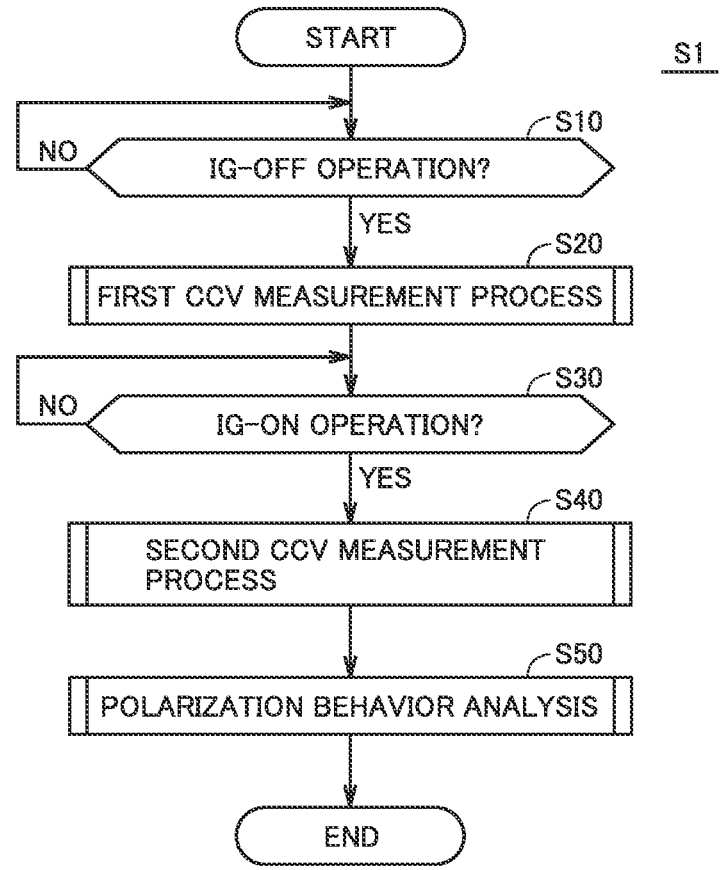
FIG. 4 is a flowchart showing the overall procedure of polarization voltage estimation processing in the present embodiment.

FIG. 4 is a flowchart showing the overall procedure of polarization voltage estimation processing (S1). In S10, the battery ECU 50 determines whether or not the vehicle 1 has been subjected to IG-OFF operation. When the user performs an IG-OFF operation on the power switch 80, the integrated ECU 90 notifies the battery ECU 50 of the fact.

When the IG-OFF operation of the vehicle 1 is executed (YES in S10), the battery ECU 50 executes the "first CCV measurement process" (S20). Subsequently, when the IG-ON operation of the vehicle 1 is executed (YES in S30), the battery ECU 50 executes the "second CCV measurement process" (S40). The battery ECU 50 then executes a "polarization behavior analysis" for analyzing the behavior of the polarization voltage VP based on the voltage VB obtained by the first and second CCV measurement processes (S50). Hereinafter, each process will be described in detail.

Figure 5:
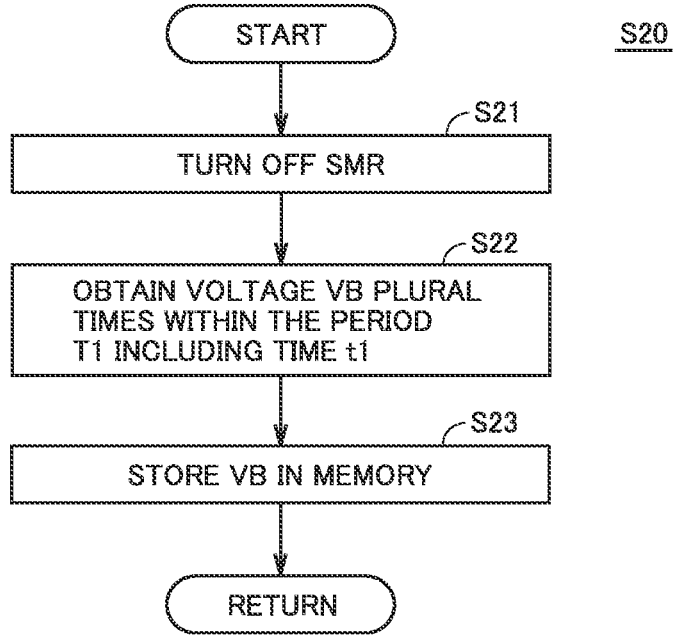
FIG. 5 is a flowchart showing a processing procedure of a first CCV measurement processing.

FIG. 5 is a flowchart showing a processing procedure of the first CCV measurement processing (S20). In S21, the battery ECU 50 electrically disconnects the battery 10 from the PCU 71 and the power converter 62 by opening (off) the SMR 20 (see time 0 in FIG. 3).

In S22, the battery ECU 50 obtains the voltage VB of the battery 10 multiple times from the voltage sensor 31 within the period T1 from time 0 to time t2.

In S23, the battery ECU 50 stores the voltage VB obtained in S22 in the memory 52 in a nonvolatile manner. Thereafter, the battery ECU 50 stops its operation (see time t2 in FIG. 3).

Figure 6:
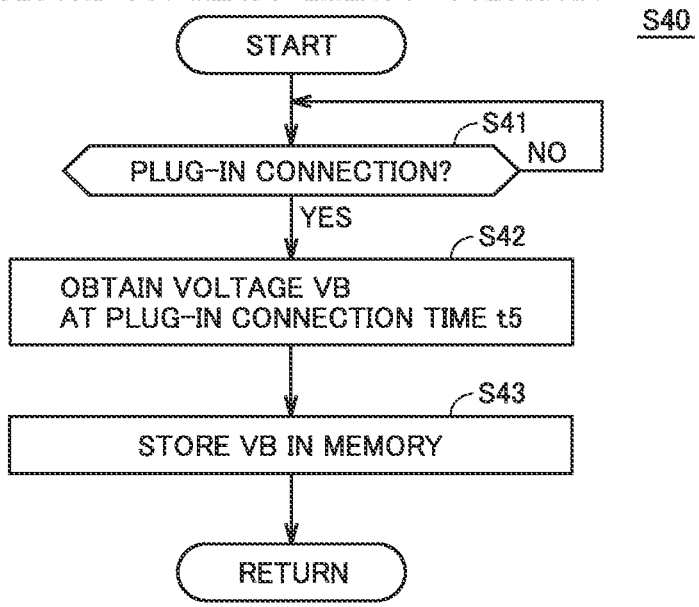
FIG. 6 is a flowchart showing a processing procedure of a second CCV measurement processing.

FIG. 6 is a flowchart showing a processing procedure of the second CCV measurement processing (S40). In S41, battery ECU 50 determines whether a connector (not shown) at the tip of the charging cable is connected to inlet 61 (plug-in connection). Battery ECU 50 waits until plug-in connection is performed (NO in S41). When the plug-in connection is performed (YES in S41), the battery ECU 50 obtains the voltage VB of the battery 10 at the time t5 from the voltage sensor 31 (S42). The battery ECU 50 stores the voltage VB obtained in S42 in the memory 52 (S43).

Figure 7:
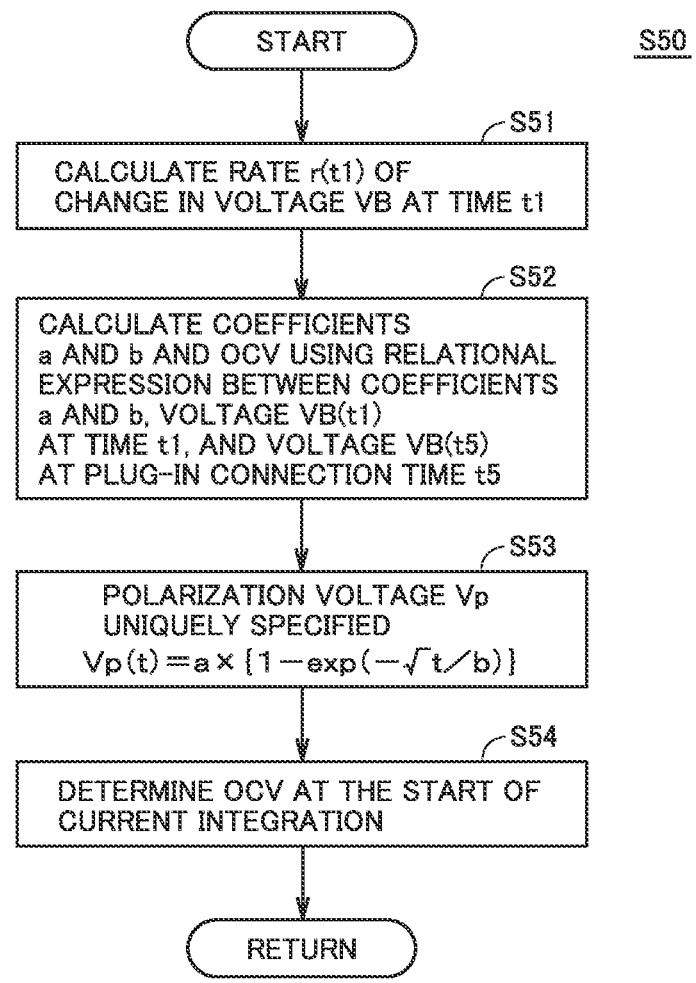
FIG. 7 is a flowchart showing a processing procedure of polarization behavior analysis.

FIG. 7 is a flowchart showing a processing procedure of polarization behavior analysis (S50). In S51, the battery ECU 50 calculates a rate r(t1) of change in the voltage VB at time t1 based on the voltage VB obtained by the first CCV measurement process. An example of a specific method of calculating the rate of change r(t1) will be described.

The battery ECU 50 calculates the rate r0 of change in the voltage VB for each constant time width Δ in the period T1 from the time 0 at which the SMR 40 is opened to the time t2 at which the battery ECU 50 is stopped. In this example, the period T1 is about 20 seconds, and the time width Δt is 10 seconds. For example, the battery ECU 50 calculates the rate r0 of change in the voltage VB between the voltage VB(1) at one second after the SMR 40 is opened and the voltage VB(11) at 11 seconds after the SMR 40 is opened.

$$r1=\{VB(11)-VB(1)\}/(\sqrt{11}-\sqrt{1})$$

Further, the battery ECU 50 calculates a rate r2 of change in the voltage VB for the voltage VB(2) at 2 seconds after the SMR 40 is opened and the voltage VB(12) at 12 seconds after the SMR 40 is opened.

$$r2=\{VB(12)-VB(2)\}/(\sqrt{12}-\sqrt{2})$$

Although the description will not be repeated, the ratios r3 to r9 of the subsequent changes in the voltage VB can be similarly calculated. The battery ECU 50 can calculate the rate r(t1) of change in the voltage VB at time t1 by performing predetermined calculation processing (for example, calculation of weighted average or maximum value) on the calculated rate r1 to r9 of change in the voltage VB. As a result, Expression (8) (represented again), which is a relational expression between the coefficients a and b, is obtained.

$$a=r(t1)\times b/\{\exp(-\sqrt{(t1)}/b)\} \tag{8}$$

In S52, the battery ECU 50 calculates the coefficient a, the coefficient b, and the OCV of the battery 10 based on the expression (8) obtained in S51, the following expression (10) relating to the detected value of the voltage VB at the plug-in connection time t5, and the following expression (11) relating to the detected value of the voltage VB at the predetermined time t1 within the period T1.

$$VB(t5)=a\times\{1-\exp(-\sqrt{(t5)}/b)\}+OCV \tag{10}$$

$$VB(t1)=a\times\{1-\exp(-\sqrt{(t1)}/b)\}+OCV \tag{11}$$

Thereby, the polarization voltage Vp is uniquely specified (S53). The calculated OCV can be used as the OCV1 at the start of current integration in S96 of the capacity estimation process (S54). The polarization estimation process according to the present embodiment is particularly effective when the time from when the battery ECU 50 is stopped to when the battery ECU 50 is restarted is short and a relatively large polarization remains at the start of current integration.

As described above, in the present embodiment, as a result of extensive studies by the present inventors, the polarization voltage Vp is described by the above-described expression (4), which is obtained by finding that the behavior of the actual polarization voltage Vp can be accurately expressed. Then, after the SMR 40 is opened, the coefficients a and b included in the expression (4) are specified using the time differential expression (5) of the polarization voltage Vp within the period T1 during which the polarization elimination of the battery 10 has progressed rapidly. As a result, the difference in the polarization elimination speed for each characteristic of the battery 10 and/or for each situation in which the battery 10 is placed can be accurately reflected in the polarization voltage Vp. Therefore, according to the present embodiment, the polarization voltage Vp of the battery 10 can be estimated with high accuracy. As a result, the OCV and full charge capacity of the battery 10 can be estimated with high accuracy.

MODIFIED EXAMPLES

In general, since the minimum number of digits that can be calculated is determined in an arithmetic unit such as an ECU, it is difficult to calculate a reasonable number with high accuracy. Therefore, calculation of exponential functions is often realized using maps. The numerical values used in the map are discontinuous (discrete), and adjacent numerical values are linearly complemented. However, since the exponential function is non-linear, the calculation accuracy may decrease when the difference between adjacent numerical values is large (when the numerical values are coarse). On the other hand, if the difference between the numerical values is reduced (if the numerical values are densely arranged), the calculation load for reading the map increases. In this modified example, a map described below is prepared and stored in the memory 52 in advance, thereby reducing the calculation load of the battery ECU 50 (processor 51) when calculating an exponential function (exp in each of the above equations).

FIG. 8 is a conceptual diagram of a map used in this modified example. In this map, nine numerical values corresponding to nine numbers are defined for each position of an index number (corresponding to x of exp(−x)). More specifically, a numerical value is defined in each of 10, 20, . . . 90 for the index of the order of −10. A numerical value is defined in each of 1, 2, . . . , 9 for the index of the order of −1. A numerical value is defined in each of 0.1, 0.2, . . . , 0.9 for the index of the order of −0.1. The same applies to the index number of −0.01, the index number of −0.001, and the index number of −0.0001.

As shown in the following equation (12), when the base of the exponential function is common (the Nipear's constant e in this example), the exponent (left side) expressed by the sum of a plurality of values (x+y) is equal to the product (right side) of the exponents x and y.

$$\exp(x+y)=\exp(x)\times\exp(y) \quad (12)$$

By utilizing this relationship, it is possible to calculate the value of the exponential function by reading the numerical values defined in the map for each order of the exponent and multiplying the read numerical values by each other.

Specifically, exp (−12.3456) is equal to exp(−10)×exp(−2)×exp(−0.3)×exp(−0.04)×exp(−0.005)×exp(−0.0006). Therefore, referring to the map, the numerical value corresponding to exp(−10), the numerical value corresponding to exp(−2), the numerical value corresponding to exp(−0.3), the numerical value corresponding to exp(−0.04), the numerical value corresponding to exp(−0.005), and the numerical value corresponding to exp(−0.0006) are read. Then, the read six numerical values may be multiplied by each other.

The number of digits (the number of valid digits) of each numerical value shown in the map of FIG. 8 is illustrative. The number of digits can be determined according to the calculation accuracy of the required polarization voltage Vp (or OCV, full charge capacity, etc.). When the required accuracy is relatively low, the calculation load of the battery ECU 50 can be further reduced by reducing the number of digits.

As described above, according to the present modified example, since the exponential function used for calculating the polarization voltage Vp can be calculated with a low calculation load, the calculation load of the battery ECU 50 can be reduced.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A battery system comprising:
a secondary battery;
a voltage sensor that detects a voltage of the secondary battery;
a power converter that transmits and receives power to and from the secondary battery;
a relay electrically connected between the secondary battery and the power converter; and
a processor configured to:
estimate a polarization voltage of the secondary battery according to a first expression of:

$$Vp=a\times\{1-\exp(-\sqrt{t}/b)\},$$

wherein the polarization voltage is represented by Vp, an elapsed time after the relay is opened is represented by t, and first and second coefficients are represented by a and b, respectively; and
determine the first and second coefficients based on first and second voltages, wherein
the first voltage is detected by the voltage sensor within a first period of time after the relay is opened,
the second voltage is detected by the voltage sensor within a second period of time before the relay is closed,
the battery system is mounted on a vehicle comprising an inlet configured to connect to a connector of a charging cable,
the power converter uses external power supplied via the inlet to charge the secondary battery, and
the second voltage is a voltage detected by the voltage sensor at a time when the connector is connected to the inlet.

2. The battery system according to claim 1, wherein differentiating both sides of the first expression with respect to time derives a second expression of:

$$dVp(t)/dt=a\times\{\exp(-\sqrt{t}/b)\}/b, \text{ and}$$

the processor is configured to:
substitute a rate of change of the polarization voltage into the second expression to obtain a relational expression between the first coefficient and the second coefficient, wherein the rate of change is calculated based on the first voltage detected a plurality of times within the first period of time; and determine the first and second coefficients based on the relational expression and the second voltage.

3. The battery system according to claim 1, wherein
the first period of time is from a time when the relay is opened to a time when the processor stops, and
the second period of time is from a time when the processor starts to a time when the relay is closed.

4. The battery system according to claim 1, further comprising:
a memory in which a map is stored, wherein
in the map, nine numerical values each corresponding to one of nine patterns of numerals are defined for each of a plurality of places of an exponent used in an exponential function, and
when the processor calculates an exponential function in the first expression, the processor is configured to:
refer to the map to read a numerical value corresponding to a numeral of each of a plurality of places of an exponent of the exponential function in the first expression; and
multiply read numerical values together.

5. A battery system comprising:
a secondary battery;
a voltage sensor that detects a voltage of the secondary battery;
a current sensor that detects a current flowing through the secondary battery;
a power converter that transmits and receives power to and from the secondary battery; and
a processor configured to:
estimate a polarization voltage of the secondary battery according to a first expression of:

$Vp = a \times \{1 - \exp(-\sqrt{t/b})\}$, wherein the polarization voltage is represented by Vp, an elapsed time after the current detected by the current sensor falls below a first predetermined value is represented by t, and first and second coefficients are represented by a and b, respectively;
determine the first and second coefficients based on first and second voltages, wherein
the first voltage is detected by the voltage sensor within a first period of time after the current detected by the current sensor falls below the first predetermined value, the second voltage is detected by the voltage sensor within a second period of time before the current detected by the current sensor exceeds a second predetermined value,
the battery system is mounted on a vehicle comprising an inlet configured to connect to a connector of a charging cable,
the power converter uses external power supplied via the inlet to charge the secondary battery, and
the second voltage is a voltage detected by the voltage sensor at a time when the connector is connected to the inlet.

6. The battery system according to claim 5, wherein
differentiating both sides of the first expression with respect to time derives a second expression of:

$dVp(t)/dt = a \times \{\exp(-\sqrt{t/b})\}/b$, and the processor is configured to:
substitute a rate of change of the polarization voltage into the second expression to obtain a relational expression between the first coefficient and the second coefficient,
wherein the rate of change is calculated based on the first voltage detected a plurality of times within the first period of time; and
determine the first and second coefficients based on the relational expression and the second voltage.

7. The battery system according to claim 5, wherein
the first period of time is from a time when the current detected by the current sensor falls below the first predetermined value to a time when the processor stops, and
the second period of time is from a time when the processor starts to a time when the current detected by the current sensor exceeds the second predetermined value.

8. The battery system according to claim 5, further comprising:
a memory in which a map is stored, wherein
in the map, nine numerical values each corresponding to one of nine patterns of numerals are defined for each of a plurality of places of an exponent used in an exponential function, and
when the processor calculates an exponential function in the first expression, the processor is configured to:
refer to the map to read a numerical value corresponding to a numeral of each of a plurality of places of an exponent of the exponential function in the first expression; and
multiply read numerical values together.

* * * * *